(12) United States Patent
Rouviere et al.

(10) Patent No.: US 10,643,856 B2
(45) Date of Patent: May 5, 2020

(54) METHOD FOR FABRICATING LATERALLY INSULATED INTEGRATED CIRCUIT CHIPS

(71) Applicant: STMicroelectronics (Tours) SAS, Tours (FR)

(72) Inventors: Mathieu Rouviere, Tours (FR); Mohamed Boufnichel, Monnaie (FR); Eric Laconde, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 53 days.

(21) Appl. No.: 16/033,334

(22) Filed: Jul. 12, 2018

(65) Prior Publication Data
US 2019/0019687 A1   Jan. 17, 2019

(30) Foreign Application Priority Data

Jul. 13, 2017   (FR) ...................... 17 56678

(51) Int. Cl.
| | |
|---|---|
| *H01L 21/311* | (2006.01) |
| *H01L 21/3065* | (2006.01) |
| *H01L 21/308* | (2006.01) |
| *H01L 21/3105* | (2006.01) |
| *H01L 21/78* | (2006.01) |

(52) U.S. Cl.
CPC ...... *H01L 21/30655* (2013.01); *H01L 21/308* (2013.01); *H01L 21/3105* (2013.01); *H01L 21/78* (2013.01); *B81C 2201/0112* (2013.01); *H01J 2237/3341* (2013.01)

(58) Field of Classification Search
CPC ............. H01L 21/30655; H01L 21/308; H01L 21/3105; H01L 21/78

USPC ......................................................... 438/700
See application file for complete search history.

(56) References Cited

U.S. PATENT DOCUMENTS

| | | | |
|---|---|---|---|
| 4,267,486 A * | 5/1981 | Thillays | G09F 9/33 257/E33.072 |
| 5,501,893 A | 3/1996 | Laermer et al. | |
| 9,543,247 B1 | 1/2017 | Ory | |
| 2010/0120227 A1* | 5/2010 | Grivna | H01L 21/78 438/462 |

OTHER PUBLICATIONS

INPI Search Report and Written Opinion for FR 1756678 dated May 3, 2018 (9 pages).

(Continued)

*Primary Examiner* — Brook Kebede
(74) *Attorney, Agent, or Firm* — Crowe & Dunlevy

(57) ABSTRACT

Laterally insulated integrated circuit chips are fabricated from a semiconductor wafer. Peripheral trenches are formed in the wafer which laterally delimit integrated circuit chips to be formed. A depth of the peripheral trenches is greater than or equal to a desired final thickness of the integrated circuit chips. The peripheral trenches are formed by a process which repeats successive steps of a) ion etching using a sulfur hexafluoride plasma, and b) passivating using an octafluorocyclobutane plasma. Upon completion of the step of forming the peripheral trenches, lateral walls of the peripheral trenches are covered by an insulating layer of a polyfluoroethene. A thinning step is performed on the lower surface of the wafer until a bottom of the peripheral trenches is reached. The insulating layer is not removed.

14 Claims, 3 Drawing Sheets

(56) References Cited

OTHER PUBLICATIONS

Abdolvand R et al: "An Advanced reactive ion etching process for very high aspect-ratio sub-micron wide trenches in silicon", Sensors and Actuators A: Physical, Elsevier BV, NL, vol. 144, No. 1, May 28, 2008 (May 28, 2008), pp. 109-116, XP022620695, ISSN: 0924-4247, DOI: 10.1016/J.SNA.2007.12.026 [extrait le Jan. 5, 2008]* p. 110, alinéa 2.-p. 115, alinéa 6. *.

* cited by examiner

METHOD FOR FABRICATING LATERALLY INSULATED INTEGRATED CIRCUIT CHIPS

PRIORITY CLAIM

This application claims the priority benefit of French Application for Patent No. 1756678, filed on Jul. 13, 2017, the content of which is hereby incorporated by reference in its entirety to the maximum extent allowable by law.

TECHNICAL FIELD

The present application relates to the field of electronic integrated circuit chips. It relates more particularly to a method for fabricating a laterally insulated integrated circuit chip.

BACKGROUND

An electronic integrated circuit chip conventionally comprises one or more electronic components formed in a semiconductor wafer before the semiconductor wafer is diced and, on one face, one or more contact metallizations (for example, pads) intended to be soldered to an external device outside the integrated circuit chip, for example a printed circuit board or another integrated circuit chip.

In certain applications, there is a need for integrated circuit chips that can be used directly without packaging, in particular diodes and more particularly protection diodes, in which the lateral faces, or flanks, of the integrated circuit chip are coated with an electrically insulating layer. Laterally insulating the integrated circuit chip in such a way makes it possible in particular to prevent, when the soldering is being carried out, the potential creep of solder up the flanks (sides) of the integrated circuit chip which may lead to a formation of a short circuit between the electrodes and the substrate of the integrated circuit chip.

FIG. 1 is a cross-sectional view of a diode 1 delimited by dotted lines and formed from the upper face of a semiconductor wafer 3, for example a silicon wafer. At this stage, the diode 1 is integral with the wafer 3.

The diode 1 is formed by an n-doped well 5 located within a p-doped region 7 of the semiconductor wafer 3. The well 5 is, for example, formed from and at the upper surface of the region 7.

Contact regions 9, 11 are formed in the well 5 and the region 7, respectively. The region 9 is n-doped and has an n+ level of doping that is higher than the doping level of the n-doped well. The region 11 is p-doped and has a p+ level of doping that is higher than the doping level of the region 7.

Cathode and anode contacts 13, 15 are formed on the contact regions 9, 11. The anode contact 15 is formed on the contact region 11 (on the right in FIG. 1). The cathode contact 13 is formed on the contact region 9 (on the left in FIG. 1). The contacts 13, 15 are made of a metal, of a superposition of metals, or of an alloy of various metals.

The upper face of this structure, apart from the contacts 13, 15, is covered with a passivation layer 17.

In practice, multiple diodes, or other electronic components, may be produced simultaneously from one and the same semiconductor wafer 3. For the sake of simplicity, only a single diode 1 is shown here.

FIG. 2 is a cross-sectional view of a step of a method for fabricating a laterally insulated integrated circuit chip 19. The integrated circuit chip 19 is an integrated circuit chip intended for use without a package. By way of example, the integrated circuit chip 19 comprises a diode that is identical to the diode 1 described with reference to FIG. 1.

In this step, a trench 23 entirely surrounding (when seen from above, encircling) the integrated circuit chip 19 is etched. The trench 23 defines the lateral faces of the integrated circuit chip 19. The trench 23 extends into the wafer 3 to a depth that is greater than or equal to the desired thickness of the integrated circuit chip 19. The trench 23 is not a through-trench, i.e. it does not extend all the way to the lower surface of the wafer 3.

Conventionally, the trench 23 is produced by means of a deep reactive ion etching process or by means of an etching process known as the Bosch process (a process of this type is described in U.S. Pat. No. 5,501,893, incorporated by reference). Such a process leads to the formation of a layer of polymer on the walls of the trench 23. This layer of polymer is generally regarded as a contaminant. Thus, the etching process is followed by a step of chemical cleaning to remove the layer of polymer.

Next, an insulating layer, for example a layer of silicon dioxide, is deposited conformally in the trench 23 in order to insulate the walls of the trench which form, as mentioned above, the lateral walls of the integrated circuit chip 19. The semiconductor wafer 3 is then cut via its back face in order to singulate the integrated circuit chip 19 by separating it from the wafer 3.

There is a need in the art for an improved method for fabricating a laterally insulated integrated circuit chip that minimizing the needed number of processing steps.

SUMMARY

In an embodiment, a method for fabricating laterally insulated integrated circuit chips from a semiconductor wafer, comprising the following successive steps: forming peripheral trenches laterally delimiting the integrated circuit chips to be formed, the depth of the peripheral trenches being greater than or equal to a desired thickness of the integrated circuit chips, wherein forming is accomplished by repeating successive steps of ion etching using a sulfur hexafluoride plasma and passivating using an octafluorocyclobutane plasma such that, upon completion of the step of forming the peripheral trenches, lateral walls of the peripheral trenches are covered by an insulating layer made of a polyfluoroethene; and thinning the semiconductor wafer via a lower face until reaching a bottom of the peripheral trenches without a prior step of removing said insulating layer.

According to one embodiment, a duration of a last passivation step is longer than a duration of preceding passivation steps by at least 50%.

According to one embodiment, a duration of a last passivation step is between 10 seconds and 7 minutes.

According to one embodiment, the thickness of the insulating layer is between 100 nm and 3 µm.

According to one embodiment, the depth of the trench is greater than the desired thickness of the integrated circuit chips by 10 to 50 µm.

According to one embodiment, the width of the trench is between 5 and 80 µm.

In an embodiment, an electronic integrated circuit chip comprises: a semiconductor substrate; one or more electronic components formed in the semiconductor substrate; and an insulating layer of polyfluoroethene, having a thickness that is between 100 nm and 3 µm, which covers lateral faces of the electronic integrated circuit chip.

BRIEF DESCRIPTION OF THE DRAWINGS

These features and advantages, and others, will be described in detail in the following non-limiting description of particular embodiments, which is given with reference to the appended figures, in which.

DETAILED DESCRIPTION

In the various figures, elements that are the same have been referenced by the same references and, in addition, the various figures have not been drawn to scale. For the sake of clarity, only those elements which are of use in understanding the described embodiments have been shown and are described in detail. In particular, the various electronic components that are liable to be contained in the integrated circuit chips have not been described in detail, the described embodiments being compatible with the majority of electronic circuits commonly contained in integrated circuit chips.

In the following description, when reference is made to qualifiers of absolute position, such as the terms "left", "right", etc., or qualifiers of relative position, such as the terms "upper", "lower", etc., or to qualifiers of orientation, such as the term "vertical", etc., reference is being made to the orientation of the elements in question in the figures. Unless otherwise specified, the expression "of the order of" means to within 10% and preferably to within 5%.

Figure 1:
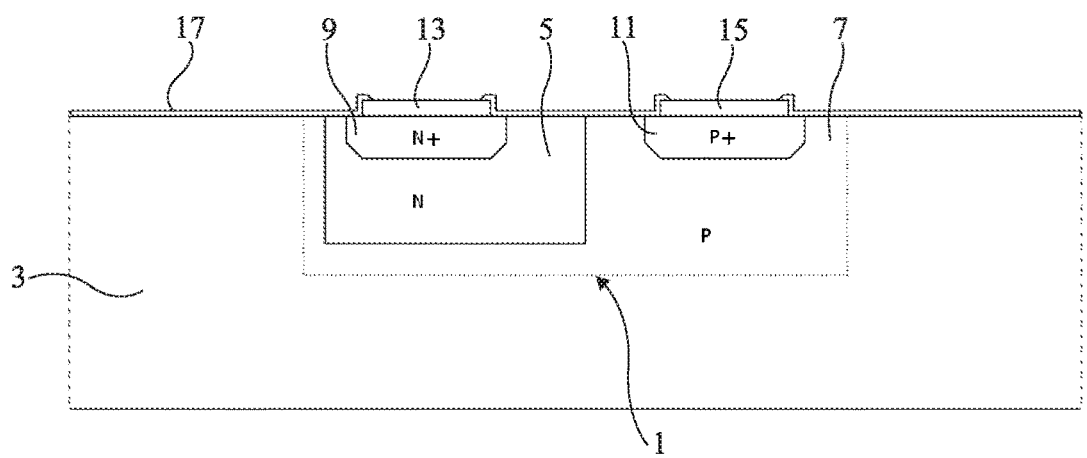
FIG. 1, described above, is a cross-sectional view of a diode.
Figure 2:
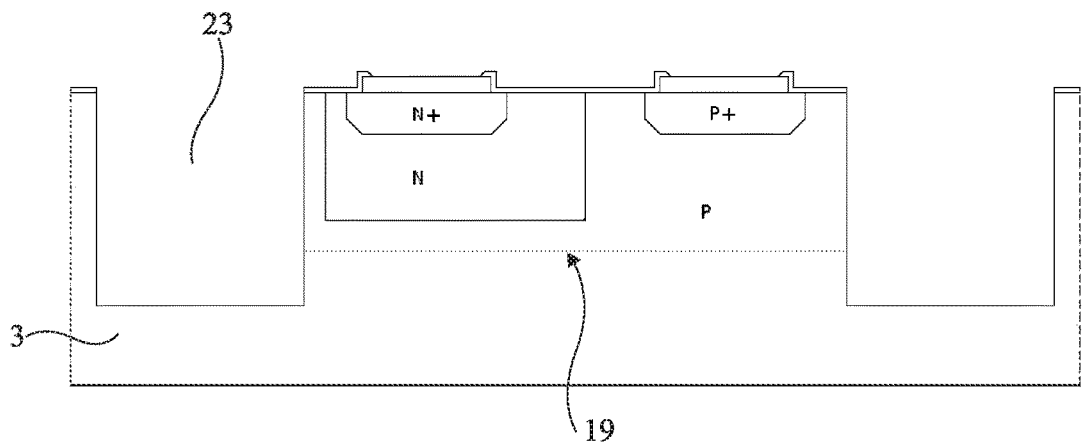
FIG. 2, described above, is a cross-sectional view of a step of a method for fabricating a laterally insulated integrated circuit chip.

FIGS. 3A to 3F are cross-sectional views of successive steps of one embodiment of a method for fabricating a laterally insulated integrated circuit chip 25, of the type of integrated circuit chip 1 as shown in FIG. 1. The integrated circuit chip 25 is an integrated circuit chip intended for use without a package. By way of example, the integrated circuit chip 25 comprises a diode that is identical to that described with reference to FIG. 1. In these figures, the elements that are the same as those in FIG. 1 are referenced by the same references.

The method presented here allows the integrated circuit chip 25 to be singulated from a processing semiconductor wafer and have lateral faces to be insulated. In order to achieve this, a peripheral trench 33 entirely surrounding the integrated circuit chip 25 is etched into the semiconductor wafer 29 in which the integrated circuit chip 25 is formed, then the semiconductor wafer 29 is thinned via its back face in order to singulate the integrated circuit chip 25 by separating it from the semiconductor wafer 29.

Figure 3A:
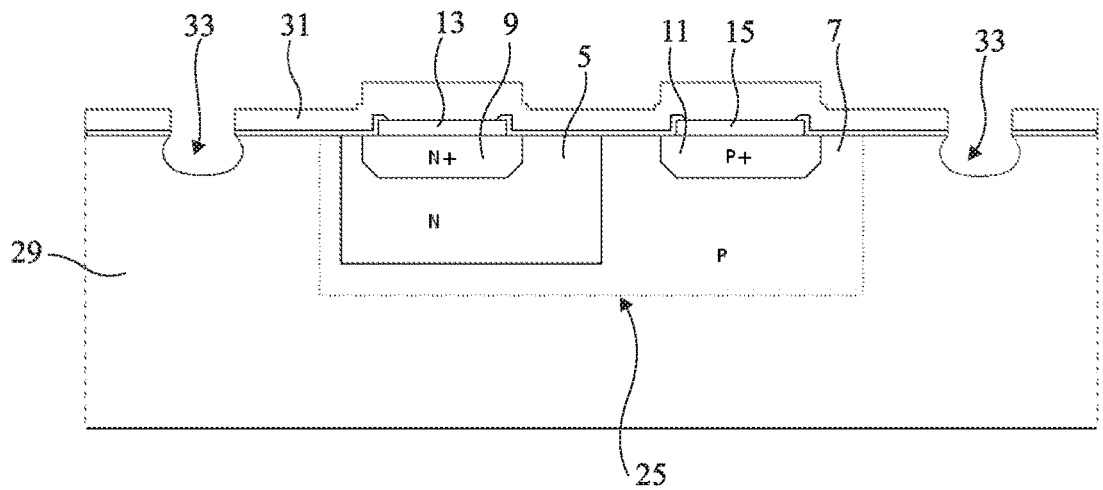
FIGS. 3A to 3F are cross-sectional views of steps of one embodiment of a method for fabricating a laterally insulated integrated circuit chip.

In the step of FIG. 3A, the diode is formed in the wafer 29, then the structure is masked by a masking layer 31. The masking layer 31 is, for example, a resist or is composed of a layer of silicon dioxide and a layer of resist. The masking layer 31 is etched, for example by means of photolithography, in order to form an etching mask.

Next, a trench 33 is etched by following the shape imposed by the masking layer 31. The trench 33 is etched at room temperature using an ion beam. This ion beam is generated by a sulfur hexafluoride ($SF_6$) etching plasma. Etching of this type is only relatively anisotropic, i.e. it etches the silicon in the vertical direction, but, to a lesser extent, it also etches it in the horizontal direction. Thus, the trench 33 has a relatively flat bottom and rather rounded lateral walls. At this stage, the trench is not deep enough to form the lateral walls of the integrated circuit chip 25. The depth of the trench 33 is between 50 and 250 µm, for example of the order of 150 µm, and the width thereof is between 5 and 80 µm, for example of the order of 50 µm.

Figure 3B:
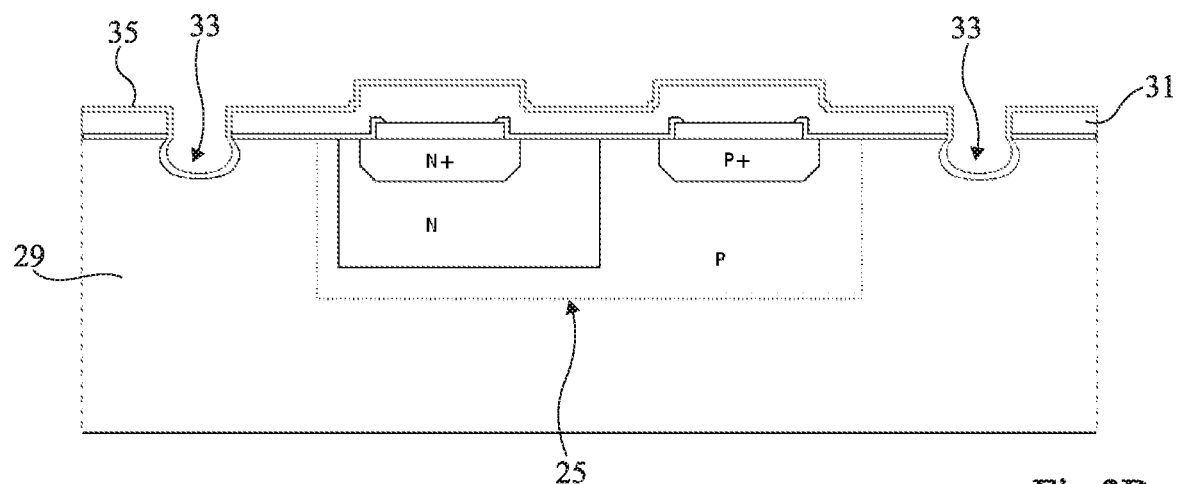

In the step of FIG. 3B, the structure of FIG. 3A is subjected to a passivation plasma. The passivation plasma is for example an octafluorocyclobutane ($C_4F_8$) plasma. The passivation plasma forms an electrically insulating passivation layer 35 on the walls of the trench 33. The duration of exposure to the passivation plasma is, for example, between 1 and 7 seconds, of the order of 3 seconds. The purpose of this passivation layer is to protect the lateral walls of the trench 33 during a subsequent etching step. The passivation layer 35 is composed of a polyfluoroethene ($C_xF_y$). The thickness of the passivation layer 35 is for example between 50 and 100 nm, for example of the order of 200 nm.

Figure 3C:
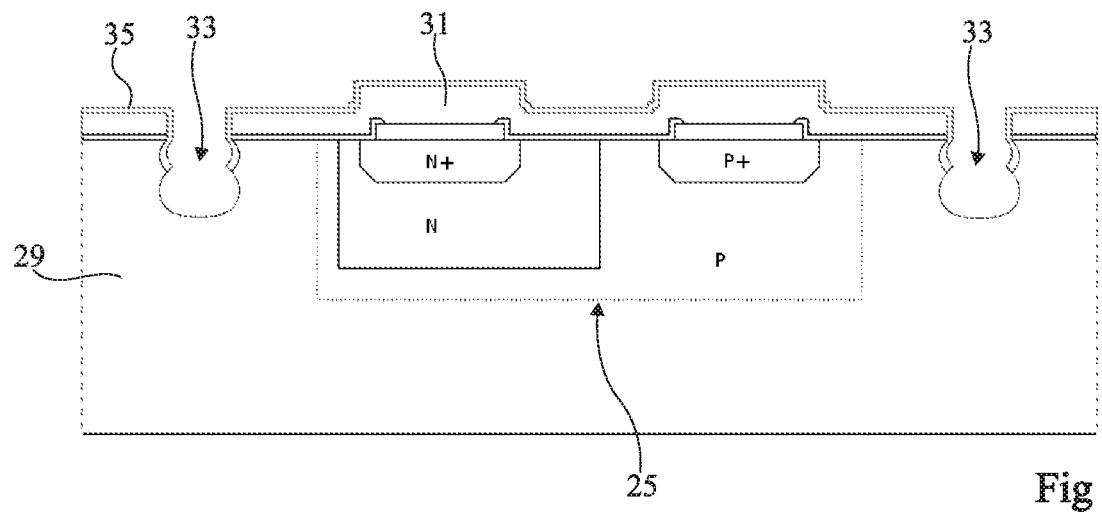

In the step of FIG. 3C, the trench 33 is deepened by means of a new relatively anisotropic etching operation of the same type as that described with reference to FIG. 3A. Since the lateral walls of the trench 33 are protected by the passivation layer 35, only the bottom of the trench 33 is etched. The newly formed portion is similar in shape to the etched portion described in FIG. 3A. The depth of the trench 33 is therefore substantially twice that of the trench of FIG. 3A.

Figure 3D:
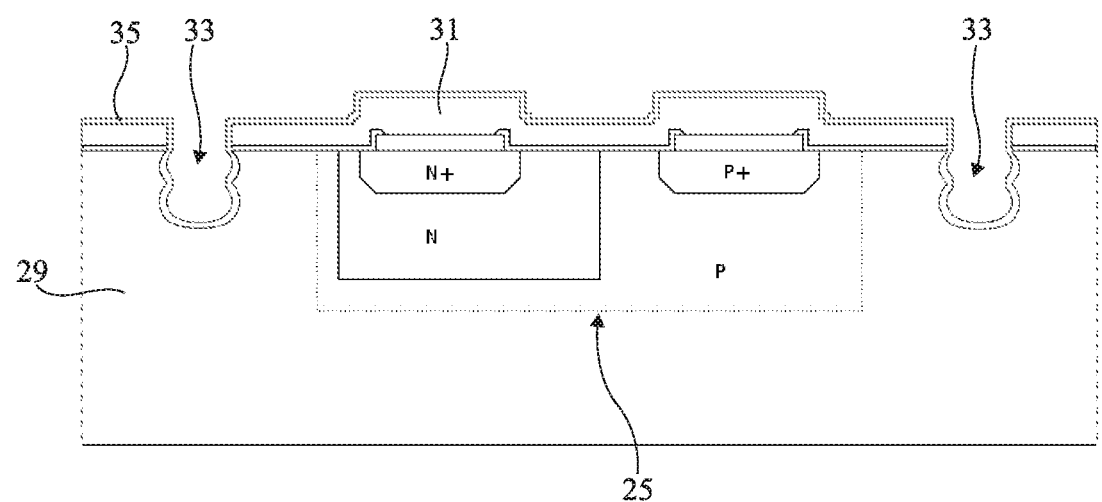

In the step of FIG. 3D, the new trench 33 is subjected to a passivation plasma. This step is the same as that described with reference to FIG. 3B. It allows the lateral walls of the trench 33 to be protected once more for subsequent etching steps.

Figure 3E:
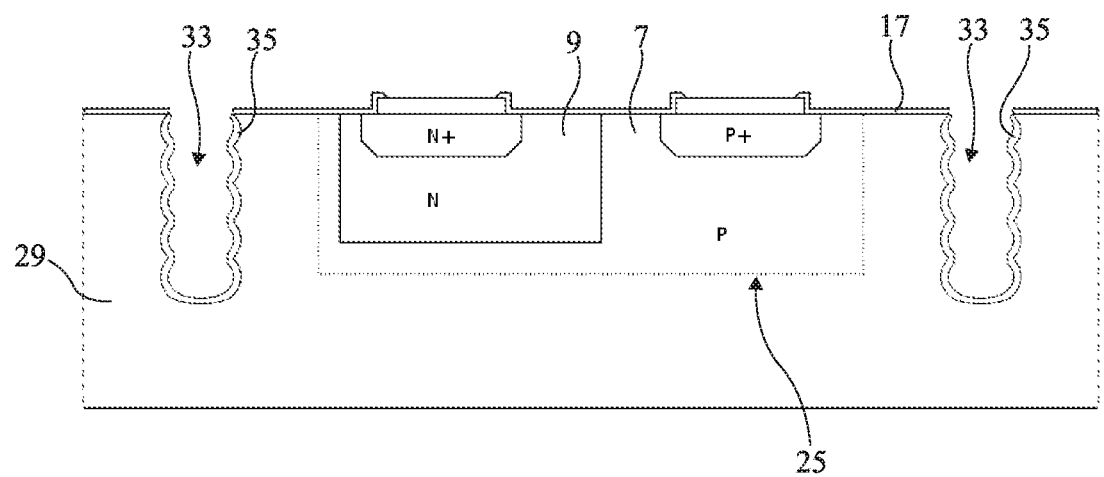

FIG. 3E illustrates the state of the peripheral trench 33 after having successively carried out multiple relatively anisotropic etching steps of the type of those described with reference to FIGS. 3A and 3C and passivation steps of the type of those described with reference to FIGS. 3B and 3D until the trench 33 has reached a depth that is greater than the thickness of the integrated circuit chip 25. In FIG. 3E, the number of etching and passivation steps shown is arbitrary. The final depth of the peripheral trench 33 is, for example, greater by 10 to 50 µm than the thickness of the integrated circuit chip 25. The trench 33 is nevertheless still not a through-trench, i.e. it does not extend all the way to the lower face of the wafer 29.

The last passivation step is longer than each of the preceding passivation steps. The duration of this step is between 10 seconds and 7 minutes, for example of the order of 2 minutes, in order to form a layer of polymer on the lateral faces of the diode having a thickness that is between 100 nm and 3 µm, for example of the order of 1 µm.

The masking layer 31 is then removed, for example by means of wet etching.

In the prior art, at the end of an etching process of the type of the Bosch etching process, a chemical cleaning step is carried out, allowing the passivation layer formed on the walls of the trench to be removed, since it is regarded as a contaminant. This layer is therefore replaced by another insulating layer, for example a layer of silicon oxide.

In the method described here, the layer of polymer is instead retained in order to insulate the lateral faces of the integrated circuit chip, since this is the last step in a fabrication process and the layer of polymer therefore cannot contaminate other steps. One advantage of this method is that it decreases the number of steps by skipping at least one cleaning step and one step of depositing a new insulating layer.

Figure 3F:
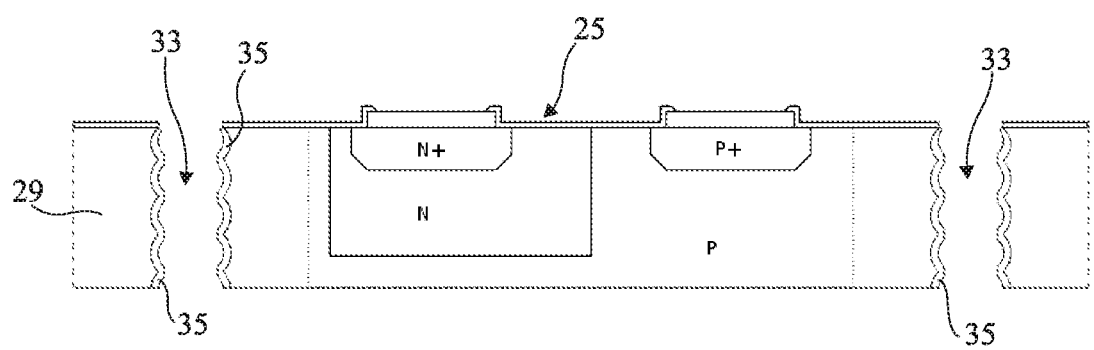

In the step of FIG. 3F, the semiconductor wafer 29 is thinned via its lower face. An adhesive carrier film (also referred to as a handle, not shown in FIG. 3F) is applied beforehand to the upper face of the assembly in order to ensure that the wafer with the integrated circuit chip is held in place during the thinning step. The wafer 29 is thinned via its back face until reaching the bottom of the trench 33 so as to singulate the integrated circuit chip 25 by separating it from the rest of the wafer 29. The thinning of the substrate or wafer 29 is achieved, for example, by cutting a back face of the wafer until the integrated circuit chip has the desired thickness. Before thinning, the thickness of the semiconductor wafer 29 was, for example, between 400 and 800 μm, for example of the order of 600 μm. After thinning, the thickness of the integrated circuit chip 25 is between 100 and 300 μm, for example of the order of 150 μm.

The integrated circuit chip 25 can then be extracted on the adhesive film with a view to mounting them in an electronic device. The integrated circuit chip 25 then has lateral walls that are electrically insulated by a layer of polyfluoroethene ($C_xF_y$).

The aim of the present embodiment is therefore a Bosch etching process in which the layer of polymer formed in the passivation steps is retained and optimized.

Particular embodiments have been described. Diverse variants and modifications will be apparent to those skilled in the art. In particular, the method has been described for the case of a integrated circuit chip comprising a diode but it could be applied to a integrated circuit chip comprising any other component.

Moreover, in practice, a multiplicity of electronic integrated circuit chips comprising a variety of components are formed simultaneously on one and the same semiconductor wafer.

The invention claimed is:

1. A method for fabricating laterally insulated integrated circuit chips from a semiconductor wafer, comprising the following successive steps:
    forming peripheral trenches laterally delimiting each of the integrated circuit chips to be formed, wherein a depth of the peripheral trenches is greater than or equal to a desired final thickness of the integrated circuit chips, wherein forming comprises repeating successive steps of: a) ion etching the semiconductor wafer using a sulfur hexafluoride plasma to form a peripheral trench portion; and b) passivating the peripheral trench portion using an octafluorocyclobutane plasma such that, upon completion of the step of forming, lateral walls of the peripheral trenches are covered by an insulating layer made of a polyfluoroethene; and
    thinning the semiconductor wafer via a lower face until reaching a bottom of the peripheral trenches, without performing a prior step of removing said insulating layer.

2. The method according to claim 1, wherein a duration of a last passivating step is longer than a duration of any passivating step by at least 50%.

3. The method according to claim 2, wherein the duration of the last passivating step is between 10 seconds and 7 minutes.

4. The method according to claim 1, wherein a thickness of the insulating layer is between 100 nm and 3 μm.

5. The method according to claim 1, wherein a depth of the peripheral trenches is greater than the desired final thickness of the integrated circuit chips by 10 to 50 μm.

6. The method according to claim 1, wherein a width of the peripheral trenches is between 5 and 80 μm.

7. An electronic integrated circuit chip, comprising:
    a semiconductor substrate;
    one or more electronic components formed in the semiconductor substrate; and
    an insulating layer of polyfluoroethene, having a thickness that is between 100 nm and 3 μm, that covers lateral faces of the semiconductor substrate which define an outer perimeter of the integrated circuit chip.

8. A method, comprising:
    performing the following steps to form a peripheral trench in a semiconductor wafer that laterally delimits an integrated circuit chip area:
        a) ion etching the semiconductor wafer using a sulfur hexafluoride plasma to form a peripheral trench portion;
        b) passivating the peripheral trench portion using an octafluorocyclobutane plasma to cover lateral walls of the peripheral trench portion with an insulating layer made of a polyfluoroethene; and
        c) repeating steps a) and b) a plurality of times such that a combined depth of the peripheral trench portions is greater than or equal to a desired final integrated circuit chip thickness;
    thinning the semiconductor wafer via a lower face until reaching a bottom of the peripheral trench to release an integrated circuit chip from the semiconductor wafer; and
    leaving the insulating layers made of the polyfluoroethene in place to laterally insulate the released integrated circuit chip.

9. The method of claim 8, further comprising mounting the released integrated circuit chip to a support substrate using a solder material, said polyfluoroethene that laterally insulates the released integrated circuit chip preventing the solder material from forming a short circuit to a semiconductor substrate of the released integrated circuit chip.

10. The method of claim 8, wherein a duration of a last step of passivating is longer than a duration of any preceding step of passivating by at least 50%.

11. The method of claim 10, wherein the duration of the last step of passivating is between 10 seconds and 7 minutes.

12. The method of claim 8, wherein a thickness of the polyfluoroethene is between 100 nm and 3 μm.

13. The method of claim 8, wherein a depth of the peripheral trench is greater than the desired final integrated circuit chip thickness by 10 to 50 μm.

14. The method of claim 8, wherein a width of the peripheral trench is between 5 and 80 μm.

\* \* \* \* \*